US008592298B2

(12) United States Patent
Romano et al.

(10) Patent No.: US 8,592,298 B2
(45) Date of Patent: Nov. 26, 2013

(54) FABRICATION OF FLOATING GUARD RINGS USING SELECTIVE REGROWTH

(75) Inventors: Linda Romano, Sunnyvale, CA (US);
David P. Bour, Cupertino, CA (US);
Andrew Edwards, San Jose, CA (US);
Hui Nie, Cupertino, CA (US); Isik C. Kizilyalli, San Francisco, CA (US);
Richard J. Brown, Los Gatos, CA (US);
Thomas R. Prunty, San Clara, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 13/335,355

(22) Filed: Dec. 22, 2011

(65) Prior Publication Data
US 2013/0164893 A1  Jun. 27, 2013

(51) Int. Cl.
*H01L 21/3205* (2006.01)

(52) U.S. Cl.
USPC ............ 438/604; 257/E21.085; 257/E21.097; 257/E21.108; 257/E21.172; 257/E21.403; 257/458; 257/483; 257/484; 257/489; 257/615; 438/167; 438/186; 438/570

(58) Field of Classification Search
USPC ................... 257/E21.085, E21.097, E21.108, 257/E21.172, E21.403, 458.483, 484, 489, 257/615; 438/167, 186, 570, 604
See application file for complete search history.

(56) References Cited

U.S. PATENT DOCUMENTS

| 2002/0168844 A1* | 11/2002 | Kuramoto et al. | 438/604 |
| 2003/0045035 A1* | 3/2003 | Shenai et al. | 438/142 |
| 2006/0118900 A1* | 6/2006 | Zeghbroeck | 257/483 |
| 2007/0096239 A1* | 5/2007 | Cao et al. | 257/458 |
| 2007/0187715 A1* | 8/2007 | Zhao | 257/135 |
| 2009/0134405 A1* | 5/2009 | Ota et al. | 257/77 |

* cited by examiner

Primary Examiner — Asok K Sarkar
(74) Attorney, Agent, or Firm — Kilpatrick Townsend & Stockton LLP

(57) ABSTRACT

A method for fabricating edge termination structures in gallium nitride (GaN) materials includes providing a n-type GaN substrate having a first surface and a second surface, forming an n-type GaN epitaxial layer coupled to the first surface of the n-type GaN substrate, and forming a growth mask coupled to the n-type GaN epitaxial layer. The method further includes patterning the growth mask to expose at least a portion of the n-type GaN epitaxial layer, and forming at least one p-type GaN epitaxial structure coupled to the at least a portion of the n-type GaN epitaxial layer. The at least one p-type GaN epitaxial structure comprises at least one portion of an edge termination structure. The method additionally includes forming a first metal structure electrically coupled to the second surface of the n-type GaN substrate.

19 Claims, 19 Drawing Sheets

US 8,592,298 B2

FABRICATION OF FLOATING GUARD RINGS USING SELECTIVE REGROWTH

CROSS-REFERENCES TO RELATED APPLICATIONS

The following regular U.S. patent applications (including this one) are being filed concurrently, and the entire disclosure of the other applications are incorporated by reference into this application for all purposes:
Application No. 13/335,329, filed Dec. 22, 2011, entitled "METHOD OF FABRICATING A GAN P-I-N DIODE USING IMPLANTATION"; and
Application No. 13/335,355, filed Dec. 22, 2011, entitled "FABRICATION OF FLOATING GUARD RINGS USING SELECTIVE REGROWTH".

The following U.S. patent applications are incorporated by reference into this application for all purposes:
Application Ser. No. 13/270,606 filed Oct. 11, 2011, entitled "METHOD AND SYSTEM FOR FLOATING GUARD RINGS IN GAN MATERIALS";
Application Ser. No. 13/312,055, filed Dec. 6, 2011, entitled "IN-SITU SIN GROWTH TO ENABLE SCHOTTKY CONTACT FOR GAN DEVICES."

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to forming edge termination structures in III-nitride semiconductor materials using selective regrowth. Merely by way of example, the invention has been applied to methods and systems for manufacturing guard rings for semiconductor devices using gallium-nitride (GaN) based epitaxial layers. The methods and techniques can be applied to a variety of compound semiconductor systems such as Schottky diodes, PIN diodes, vertical junction field-effect transistors (JFETs), thyristors, and other devices.

According to one embodiment of the present invention, a method for fabricating edge termination structures in gallium nitride (GaN) materials is provided. The method includes providing a n-type GaN substrate having a first surface and a second surface, forming an n-type GaN epitaxial layer coupled to the first surface of the n-type GaN substrate, and forming a growth mask coupled to the n-type GaN epitaxial layer. The method further includes patterning the growth mask to expose at least a portion of the n-type GaN epitaxial layer, and forming at least one p-type GaN epitaxial structure coupled to the at least a portion of the n-type GaN epitaxial layer. The at least one p-type GaN epitaxial structure comprises at least one portion of an edge termination structure. The method additionally includes forming a first metal structure electrically coupled to the second surface of the n-type GaN substrate.

According to another embodiment of the present invention, a method of fabricating a semiconductor device is provided. The method includes providing a III-nitride substrate of a first conductivity type characterized by a first dopant concentration, forming a III-nitride epitaxial layer of the first conductivity type coupled to a first surface of the III-nitride substrate, and forming a growth mask coupled to the III-nitride epitaxial layer. The method further includes patterning the growth mask to expose at least one portion of the III-nitride epitaxial layer, and forming at least one edge termination structure of a second conductivity type coupled to the at least one portion of the III-nitride epitaxial layer. The at least one edge termination structure comprises a III-nitride epitaxial structure. Finally, the method includes removing the growth mask.

According to yet another embodiment of the present invention, a method of fabricating a Schottky barrier diode is provided. The method includes providing a III-nitride substrate of a first conductivity type characterized by a first dopant concentration, forming a III-nitride epitaxial layer of the first conductivity type coupled to a first surface of the III-nitride substrate, and forming a growth mask coupled to the III-nitride epitaxial layer. The method further includes patterning the growth mask to expose a first portion of a surface of the III-nitride epitaxial layer, and forming at least one III-nitride epitaxial structure of a second conductivity type coupled to the first portion of the surface of the III-nitride epitaxial layer. The at least one III-nitride epitaxial structure is configured to provide edge termination to the Schottky barrier diode. The method additionally includes removing the growth mask to expose a second portion of the surface of the III-nitride epitaxial layer, and forming a first metal structure coupled to the second portion of the surface of the III-nitride epitaxial layer to create a Schottky contact.

Numerous benefits are achieved by way of the present invention over conventional techniques. For example, embodiments of the present invention enable the use of thicker III-nitride semiconductor layers in vertical device configuration in comparison with conventional techniques, which can result in devices capable of operating at higher voltages and lower resistance than conventional devices lateral or non III-nitride devices. Additionally, the use of etching techniques detailed herein provides enhanced accuracy over conventional techniques, providing more precise definition of edge termination structures. These and other embodiments of the invention, along with many of its advantages and features, are described in more detail in conjunction with the text below and attached figures.

BRIEF DESCRIPTION OF THE DRAWINGS

FIGS. 10-13 are simplified cross-sectional diagrams illustrating fabrication of a PIN diode in GaN with edge termination structures formed through selective epitaxial regrowth according to another embodiment of the present invention;

Figure 1A:
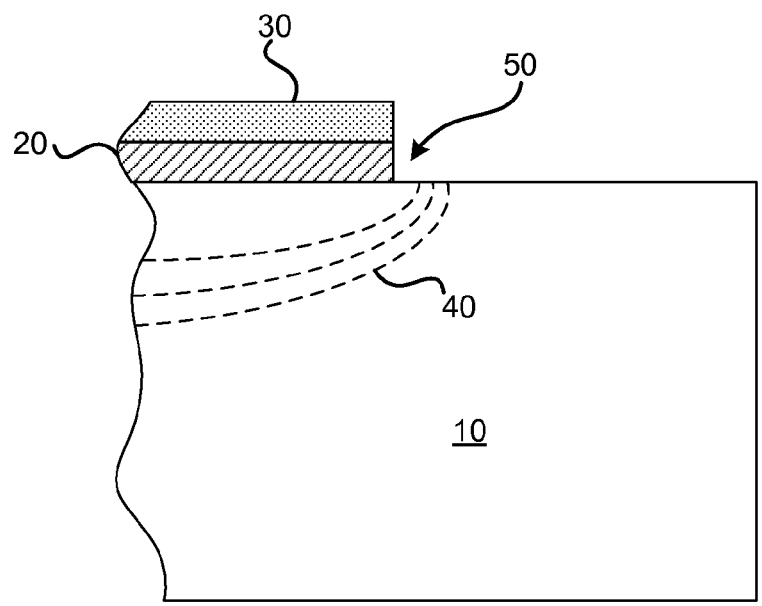
FIGS. 1A-1B are simplified cross-sectional diagrams of a portion of a semiconductor device, illustrating how edge termination structures improve the semiconductor device's performance, according to an embodiment of the present invention.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Embodiments of the present invention relate to electronic devices. More specifically, the present invention relates to forming edge termination structures, such as floating guard rings, using selective epitaxial regrowth to provide edge termination for semiconductor devices. Merely by way of example, the invention has been applied to methods and systems for manufacturing edge termination structures using gallium-nitride (GaN) based epitaxial layers. The methods and techniques can be applied to form a variety of types of edge termination structures that can provide edge termination to numerous types of semiconductor devices, including, but not limited to, junction field-effect transistors (JFETs), diodes, thyristors, vertical field-effect transistors, thyristors, and other devices, including merged PIN, Schottky diodes.

GaN-based electronic and optoelectronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, μ, is higher than competing materials for a given background doping level, N. This provides low resistivity, ρ, because resistivity is inversely proportional to electron mobility, as provided by equation (1):

$$\rho = \frac{1}{q\mu N}, \qquad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \qquad (2)$$

where A is the cross-sectional area of the channel or current path.

As described herein, semiconductor devices utilizing edge termination structures are able to exploit the high critical electric field provided by GaN and related alloys and heterostructures. Edge termination techniques such as field plates and guard rings provide proper edge termination by alleviating high fields at the edge of the semiconductor device. When properly employed, edge termination allows a semiconductor device to break down uniformly at its main junction rather than uncontrollably at its edge.

According to embodiments of the present invention, gallium nitride (GaN) epitaxy on bulk pseudo-bulk GaN substrates is utilized to fabricate edge termination structures and/or semiconductor devices not possible using conventional techniques. For example, conventional methods of growing GaN include using a foreign substrate such as silicon carbide (SiC) or sapphire Al2O3. This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create various types of semiconductor devices.

Figure 1B:
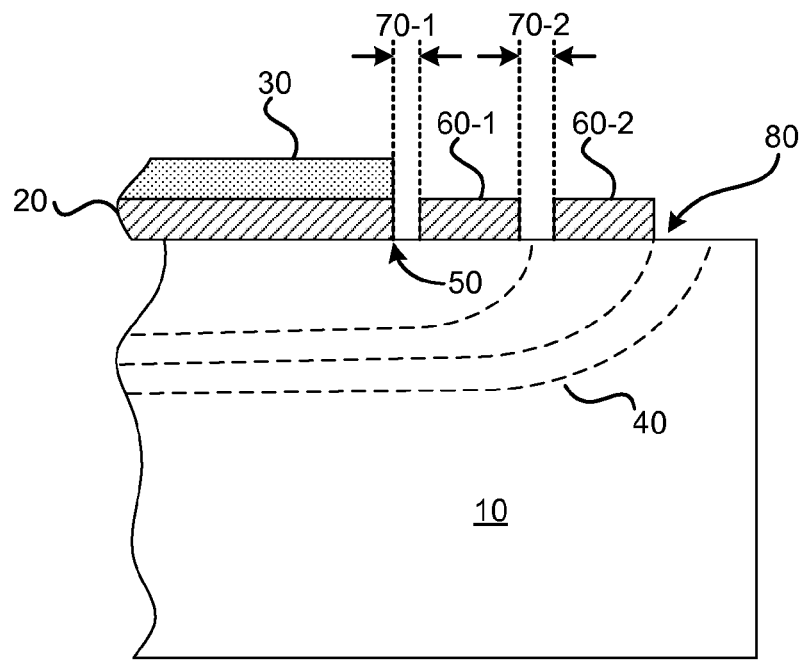

FIGS. 1A-1B are simplified cross-sectional diagrams of a portion of a semiconductor device, according to one embodiment, illustrating how the edge termination structures provided herein can be used to improve the semiconductor device's performance using edge termination. FIG. 1A illustrates a diode structure where a p-n junction is created between a p-type semiconductor layer 20 formed on an n-type semiconductor substrate 10, which can be an epitaxial layer. In this example, a metal layer 30 is also formed on the p-type semiconductor layer 20 to provide electrical contact to the diode. Metal layer 30 may or may not share the same edge as p-type semiconductor layer 20 in FIG. 1A and FIG. 1B.

Because the diode of FIG. 1A has no termination structures, its performance is reduced. The electric field 40 (represented in FIG. 1A as potential lines), is crowded near the edge 50 of the diode, causing breakdown at a voltage that can be much less than the parallel plane breakdown voltage for the diode. This phenomenon can be especially detrimental to the operation of high-voltage semiconductor devices.

FIG. 1B illustrates how edge termination structures 60 can be used to alleviate field crowding near the edge 50 of the diode. The edge termination structures 60, which can be made of the same p-type semiconductor material as the p-type semiconductor layer 20 of the diode, are placed near the diode and allowed to float to voltages such that the electric field 40 extends laterally beyond the edge 50 of the diode. By spatially extending the potential drop and reducing the curvature of the equipotential lines and thus the electric field in this manner, the edge termination structures 60 help enable the diode to operate at a breakdown voltage much closer to its parallel plane breakdown voltage.

The number of p-GaN regions in the edge termination structure 60 can vary. In some embodiments, a single p-GaN region may be sufficient. In other embodiments, as much as seven p-GaN regions or more can be used. The number of p-GaN regions depends on the amount of voltage being supported by the edge termination structure. For example, the voltage to which each p-GaN region floats can be designed to decrease with each successive region such that the termination structure farthest from the semiconductor device has the lowest voltage. For example, if the p-type semiconductor layer 20 is biased at 600V, the p-GaN regions 60-1 and 60-2 can float to 400V and 200V, respectively. Of course, voltages can vary, depending on the physical dimensions and configuration of the semiconductor device and edge termination structures 60. However, ensuring the outermost edge termination structure 60-2 has sufficiently low voltage such that the electric field at its edge is lower than the peak field at the semiconductor's main junction can help ensure the semiconductor device operates at or near its parallel plane breakdown voltage.

The spaces 70 (also referred to herein as "spacings") between p-GaN regions in the edge termination structure 60 can vary. According to some embodiments, width of the spaces 70 between p-GaN regions 60 can increase as the distance from the semiconductor structure increases. For example, as shown in the embodiment of FIG. 1B, the width of a first space 70-1 between the first p-GaN region 60-1 and the semiconductor structure can be smaller than the second space 70-2 between the second p-GaN region 60-2 and the first p-GaN region 60-1. The width of the spaces 70 can vary depending on the application. According to one embodiment, the width of p-GaN region 60, ranging from 1 µm to 5 µm, can be approximately the same for all p-GaN regions 60, and the width of spaces 70 between p-GaN regions 60 increases with increased distance from the semiconductor device, ranging anywhere from 0.5 µm to 6 µm. In other embodiments, other spacings are utilized as appropriate to the particular application.

Methods for the formation of edge termination structures in GaN and related alloys and heterostructures can differ from those used in other semiconductors, such as Si. In Si, for example, edge termination structures often are formed by using implantation into the semiconductor substrate. On the other hand, in GaN and related alloys and heterostructures, using the techniques described herein, epitaxial structures can be selectively regrown to provide the edge termination structure 60. The formation of the edge termination structure 60 using selective regrowth can provide better spatial control than implantation, allowing better control of the position and spacing of the edge termination structures 60, and, ultimately, better control of the electric field 40.

Figure 2:
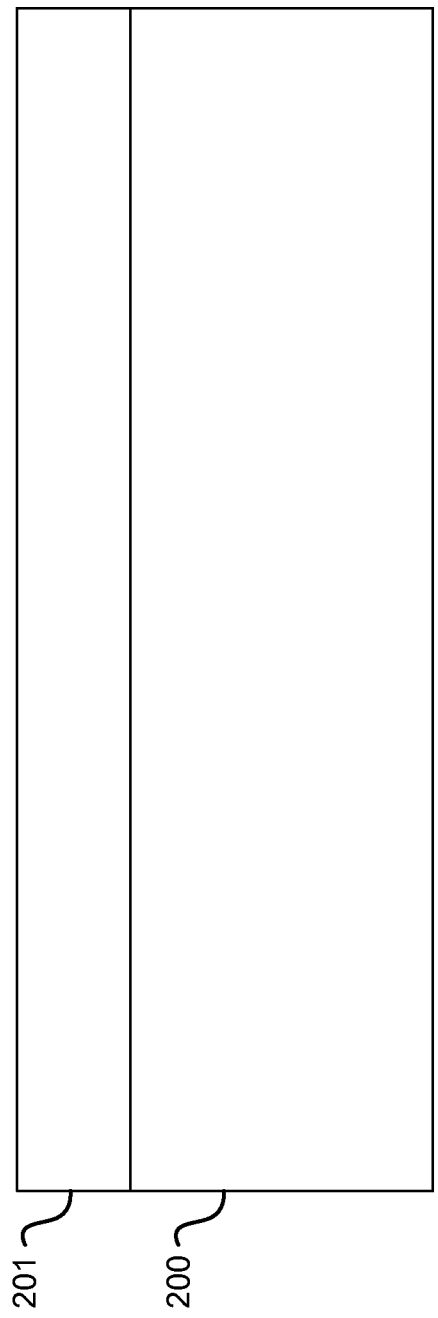
FIGS. 2-10B are simplified cross-sectional diagrams illustrating the fabrication of a Schottky diode in gallium-nitride (GaN) with edge termination structures formed through selective epitaxial regrowth according to an embodiment of the present invention.

FIGS. 2-10B illustrate a process for creating a Schottky diode in GaN with and edge termination structure formed through the selective regrowth of epitaxial structures. Referring to FIG. 2, a GaN epitaxial layer 201 is formed on a GaN substrate 200 having the same conductivity type. As indicated above, the GaN substrate 200 can be a pseudo-bulk or bulk GaN material on which the GaN epitaxial layer 201 is grown. Dopant concentrations (e.g., doping density) of the GaN substrate 200 can vary, depending on desired functionality. For example, a GaN substrate 200 can have an n+ conductivity type, with dopant concentrations ranging from $1\times10^{17}$ cm$^{-3}$ to $1\times10^{20}$ cm$^{-3}$. Although the GaN substrate 200 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the GaN epitaxial layer 201 can also vary, depending on desired functionality. The GaN epitaxial layer 201 can serve as a drift region for the Schottky diode, and therefore can be a relatively low-doped material. For example, the GaN epitaxial layer 201 can have an n− conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the drift region.

The thickness of the GaN epitaxial layer 201 can also vary substantially, depending on the desired functionality. As discussed above, homoepitaxial growth can enable the GaN epitaxial layer 201 to be grown far thicker than layers formed using conventional methods. In general, in some embodiments, thicknesses can vary between 0.5 µm and 100 µm, for example. In other embodiments thicknesses are greater than 5 µm. Resulting parallel plane breakdown voltages for the Schottky diode 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, or the like. p-type dopants can include magnesium, beryllium, calcium zinc, or the like.

Figure 3:
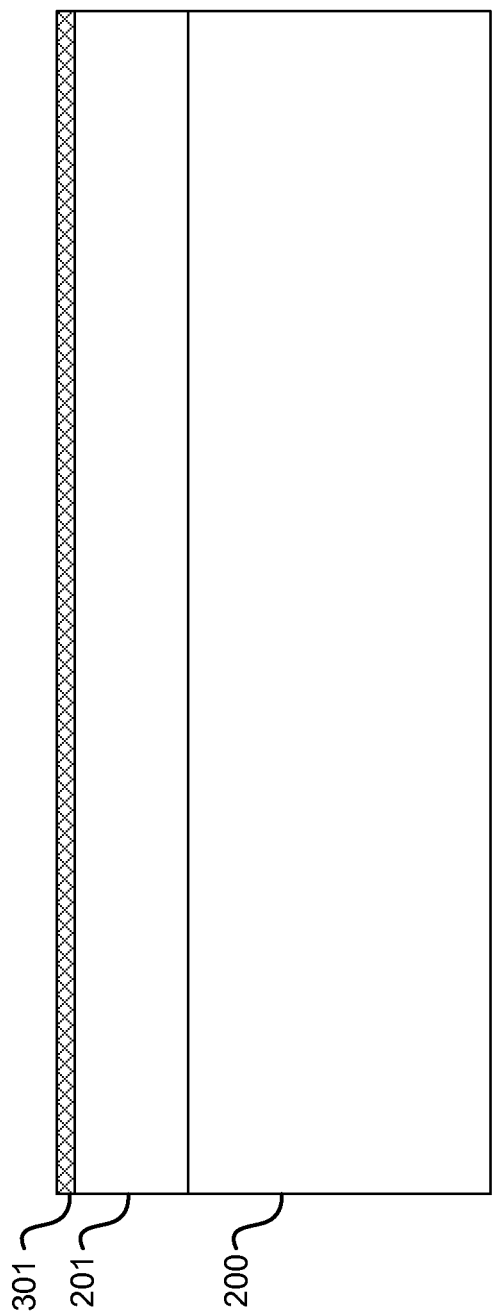

As also shown in FIG. 3, a SiN layer 301 may be deposited, or otherwise formed, in-situ over or on the GaN epitaxial layer 201. Various deposition techniques may be used for in-situ deposition as will be appreciated by those of skill in the art. The GaN epitaxial layer 201 may be advantageous in, for example, to protecting the GaN surface during the device fabrication process up to and until deposition of a Schottky metal, epitaxial layer, or other structure coupled to the GaN epitaxial layer 201. Embodiments of the present invention are not limited to this particular implementation and use of the in-situ SiN layer as a protection layer during different portions of the device fabrication process are included within the scope of the present invention.

The inventors have determined that structural damage may be present at the interface of subsequently regrown layers due, for example, to the fact that GaN-based materials are quite hard and present issues for the etching processes that are commonly used, sometimes utilizing a significant sputtering component. Therefore, for example, regrowth of a p-type GaN layer on an n-type GaN surface may result in the formation of a p-n junction that is characterized by less than optimal electrical characteristics including leakage currents. Without limiting embodiments of the present invention, the inventors believe that in-situ formation of a SiN layer, which may be partially or totally removed later, over the GaN epitaxial layer used as the regrowth surface can be effective in protecting the GaN layer and result in better junction formation during regrowth or other growth processes.

The SiN layer 301 may be deposited according to techniques known in the art, and may include, for example, $Si_3N_4$, $SiN_x$ or other compositions. Thus, the use of the term "SiN" layer is intended to include all compositions of materials including silicon and nitrogen in stoichiometric and other proportions. In embodiments, the in-situ SiN layer may be formed, for example, using silane from a doping source or a separate direct silane source or any Si precursor. Reactive nitrogen is also typically provided in the form of $NH_3$ that would be already present for GaN growth. In some embodiments, an additional ex-situ $SiO_2$, oxynitride, or $Al_2O_3$ layer may be applied to the in-situ SiN layer, or remaining portions of the SiN layer, e.g., to provide even further selectivity for subsequent regrowth steps or the like. Other in-situ layers could include a lower temperature polycrystalline GaN or AlN layer that could easily be removed by wet etching after processing.

Figure 4:
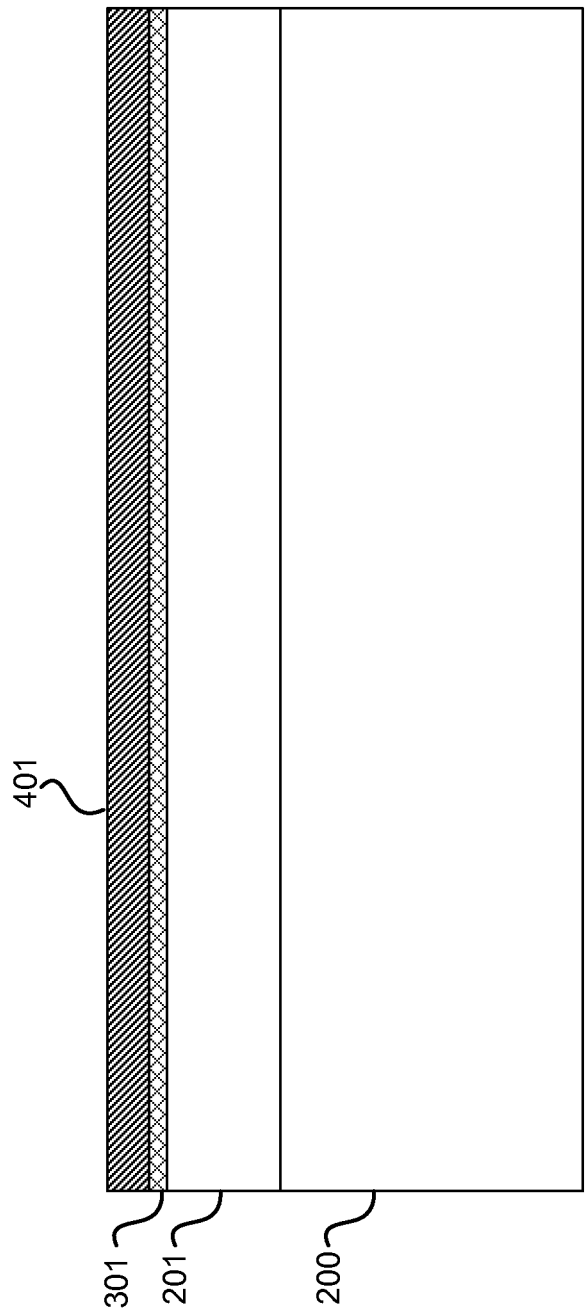

FIG. 4 depicts the formation of an optional oxide layer 401 formed over, and optionally in contact with, the SiN layer 301. Optional oxide layers, such as oxide layer 401 (e.g., Si$_x$O$_y$ or Si$_x$O$_y$N$_z$) may be used, for example, to improve selectivity of subsequent regrowth layers, such as those discussed herein.

Figure 5:
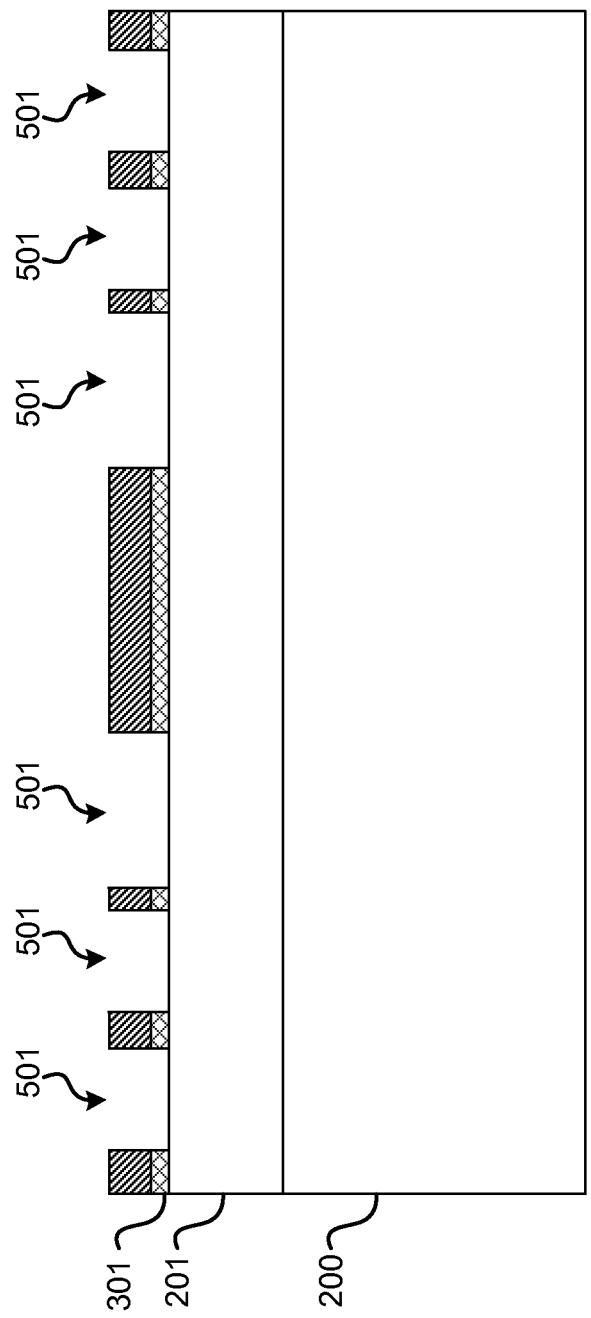

Referring to FIG. 5, a plurality of recesses 501 may be etched, or otherwise formed, through the SiN layer 301 and, optionally, into the GaN epitaxial layer 201. The shape and/or pattern of the recesses 501 is a function of the particular devices (e.g., an edge termination structure) to be fabricated, details of the etching process, and the like, and will vary depending on the particular application. Although a plurality of recessed trenches are illustrated in FIG. 5, embodiments of the present invention are not limited to this particular shape and pattern, and other shapes and patterns can be employed. As illustrated in FIG. 5, the etch process may be a substantially anisotropic etch with little to no undercutting under the SiN layer 301. In other embodiments, some undercutting associated with an isotropic etch component may be observed. Isotropic etching is a viable process for some embodiments of the present invention.

Figure 6:
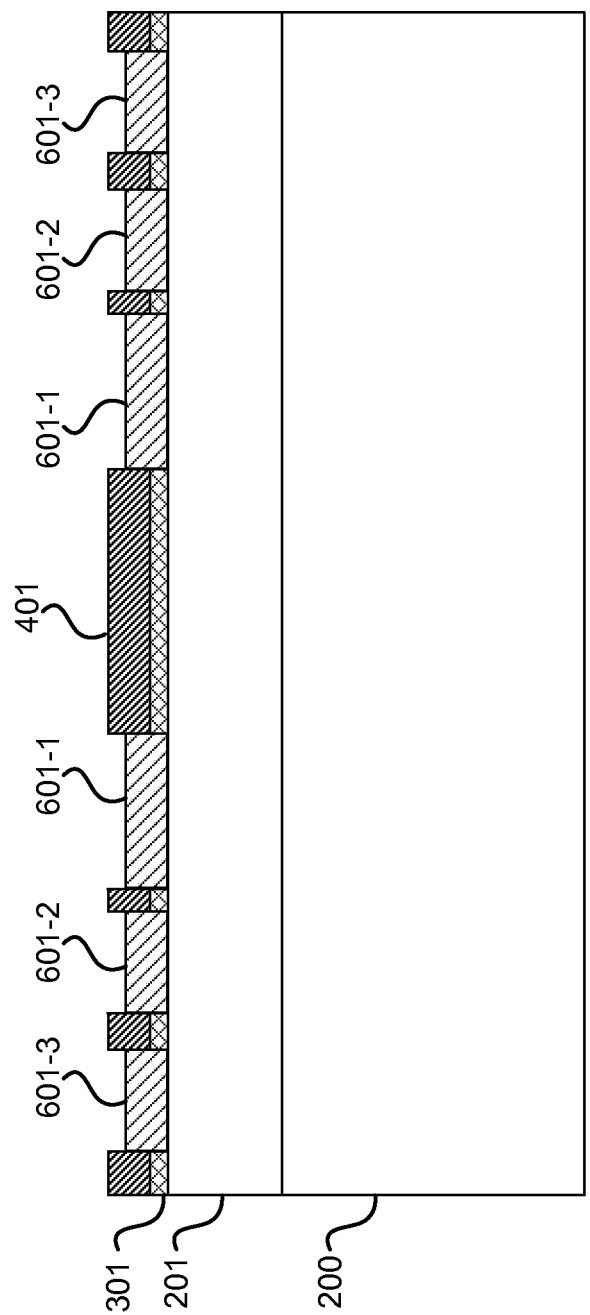

Referring to FIG. 6, a selective regrowth process is used to form epitaxial GaN for edge termination 601 in the recesses 501 but, in the illustrated embodiment, not over the remaining portions of the SiN layer 301 and oxide layer 401. For example, a p+ GaN regrowth may be provided that is selective to growth on the underlying n-GaN drift layer and not on the SiN and oxide layers, 301 and 401, respectively. The regrowth process can provide a p-type material in contact with an n-type material as well as an n-type material in contact with a p-type material. As discussed above, additional layers that increase regrowth selectivity can be utilized as appropriate to the particular application. One of ordinary skill in the art would recognize many variations, modifications, and alternatives.

Figure 7:
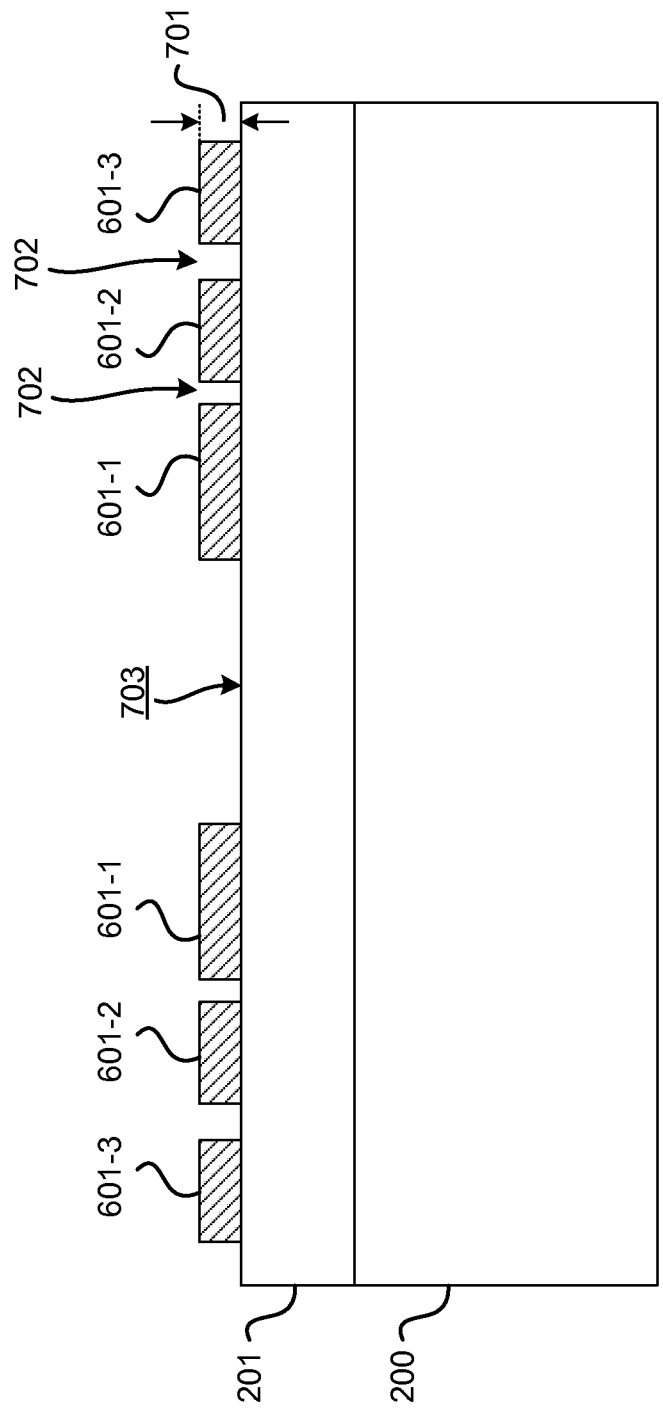

FIG. 7 illustrates how masking SiN and oxide layers, 301 and 401, are removed through etching and/or other removal processes, leaving the edge termination structure 601 coupled to the GaN epitaxial layer 201. In this embodiment, not only does the removal of the masking layers provide spacings 702 between the edge termination structures 601, but the removal further exposes a surface 703 of the GaN epitaxial layer 201 to which a Schottky contact can be subsequently coupled.

The thickness 701 of the edge termination structures 601 can vary, depending on desired functionality. In some embodiments, the thickness 701 of the edge termination structures 601 is between 0.1 μm and 5 μm. In other embodiments, the thickness 701 of the edge termination structures 601 is between 0.3 μm and 1 μm.

The edge termination structures 601 can be highly doped, for example in a range from about $5 \times 10^{17}$ cm$^{-3}$ to about $1 \times 10^{20}$ cm$^{-3}$. Additionally, as with other epitaxial layers, the dopant concentration of the edge termination structures 601 can be uniform or non-uniform as a function of thickness. In some embodiments, the dopant concentration increases with thickness, such that the dopant concentration is relatively low near the GaN epitaxial layer 201 and increases as the distance from the GaN epitaxial layer 201 increases. Such embodiments provide higher dopant concentrations at the top of the edge termination structure 601 where metal contacts can be subsequently formed. Other embodiments utilize heavily doped contact layers (not shown) to form ohmic contacts.

One method of forming the edge termination structure 601, and other layers described herein, can be through a regrowth process that uses an in-situ etch and diffusion preparation processes. These preparation processes are described more fully in U.S. patent application Ser. No. 13/198,666, filed on Aug. 4, 2011, the disclosure of which is hereby incorporated by reference in its entirety.

Figure 8:
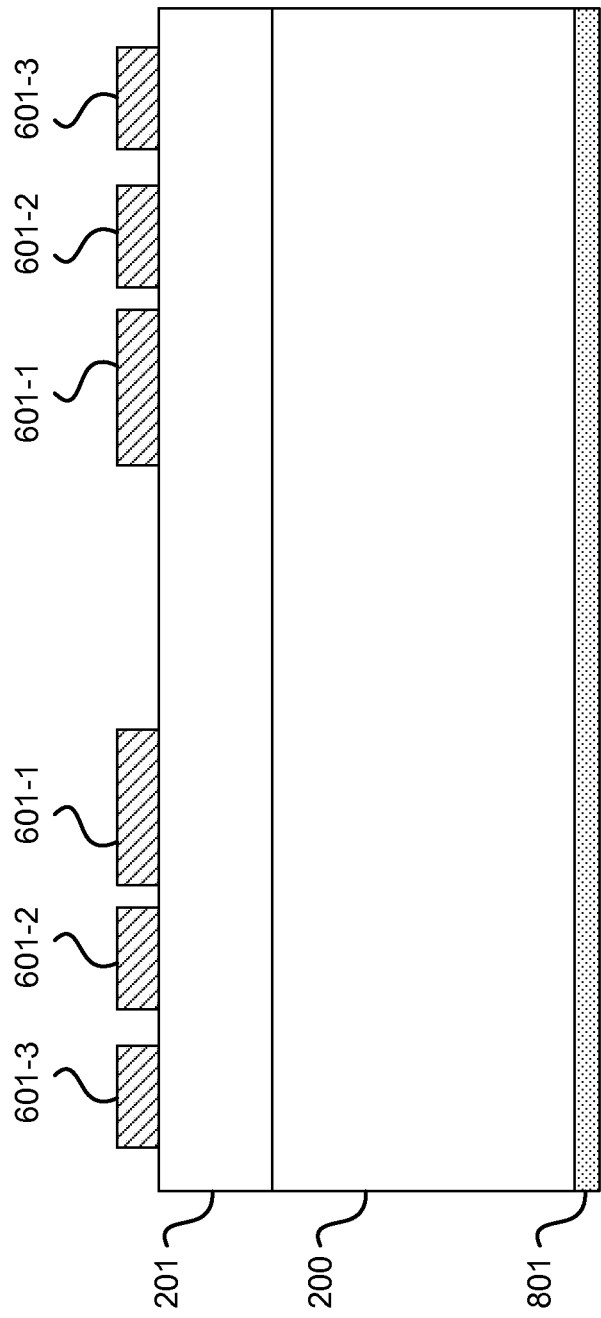

FIG. 8 illustrates the formation of a first metal structure below the GaN substrate 200. The first metal structure 801 can be one or more layers of ohmic metal that serve as a substrate contact for the device. For example, the first metal structure 801 can comprise a titanium-aluminum (Ti/Al) ohmic metal. Other metals and/or alloys can be used including, but not limited to, aluminum, nickel, gold, combinations thereof, or the like. In some embodiments, an outermost metal of the first metal structure 801 can include gold, tantalum, tungsten, palladium, silver, or aluminum, combinations thereof, and the like. The first metal structure 801 can be formed using any of a variety of methods such as sputtering, evaporation, or the like.

Figure 9:
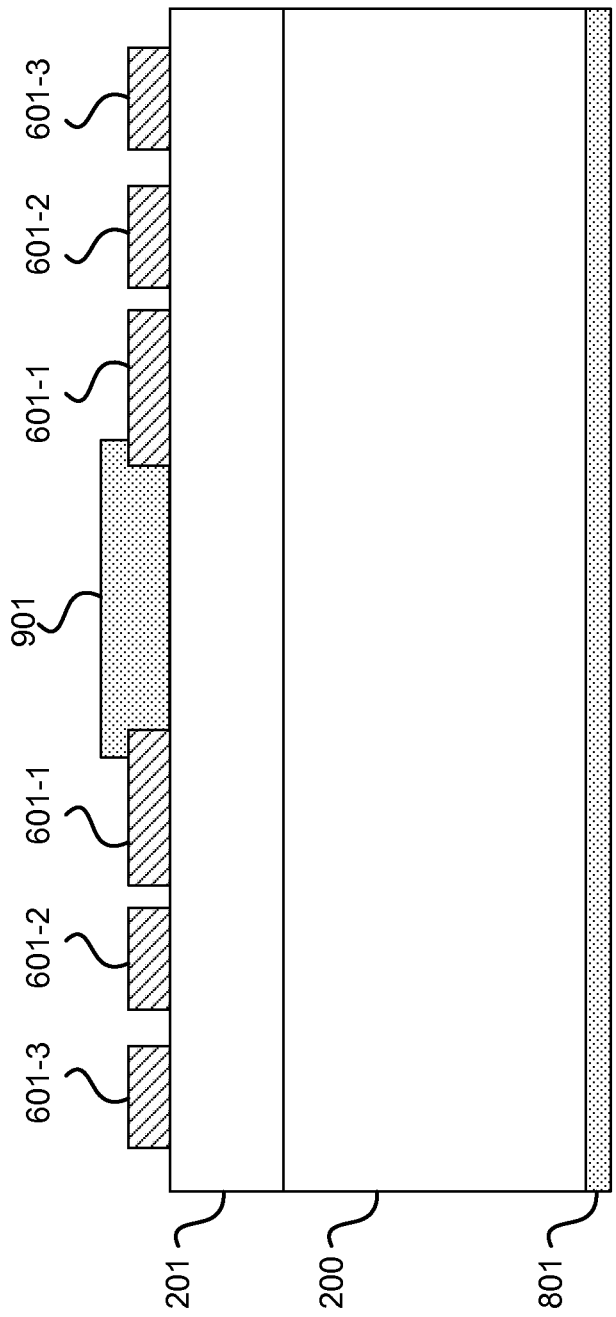

FIG. 9 illustrates the formation of a second metal structure 901 on the exposed surface 703 (shown in FIG. 7) of the GaN epitaxial layer 201. The second metal structure 901 can be one or more layers of metal and/or alloys to create a Schottky barrier with the GaN epitaxial layer 201, and the second metal structure 901 further can overlap portions of the nearest edge termination structure 601-1. The second metal structure 901 can be formed using a variety of techniques, including lift-off and/or deposition with subsequent etching, which can vary depending on the metals used. In some embodiments, the second metal structure 901 can include nickel, platinum, palladium, silver, gold, and the like.

Figure 10A:
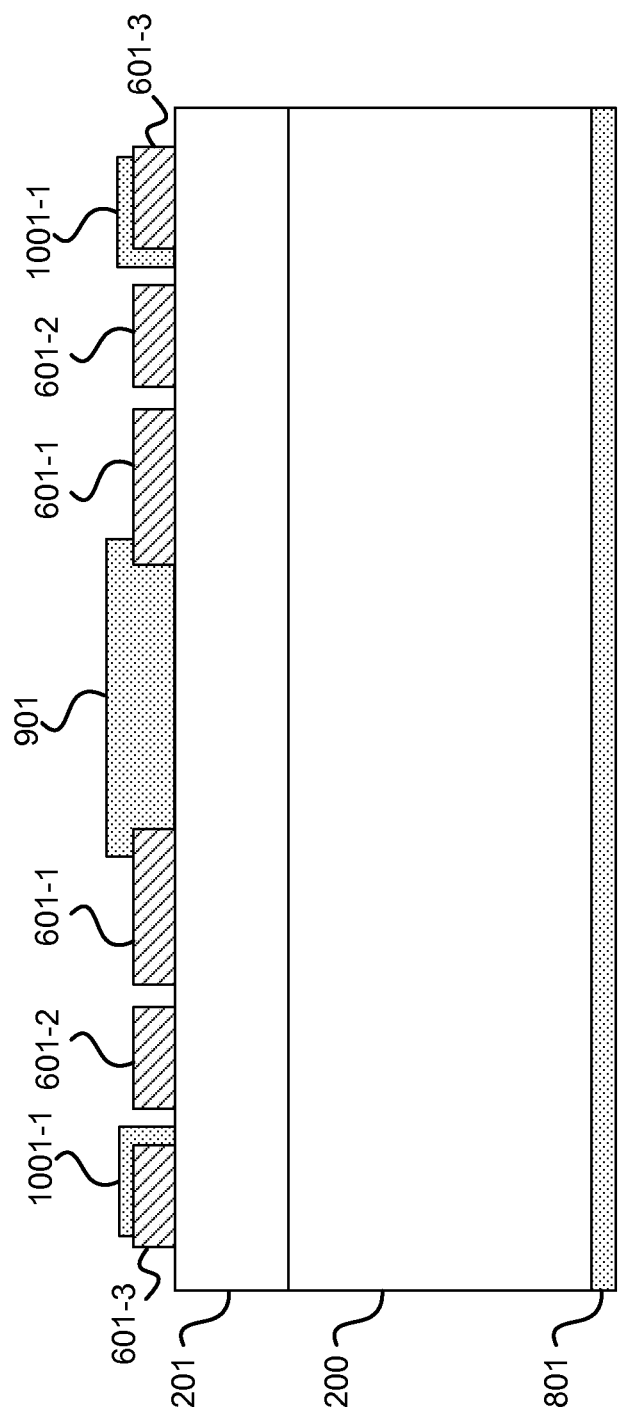

FIG. 10A illustrates the optional formation of metal field plates 1001-1 coupled to the edge termination structure 601-3. These metal field plates 1001-1 can be formed using the same techniques used to form the second metal structure 901, and also can include similar metals and/or alloys. In alternative embodiments, metal field plates 1001 can be located on any or all parts of the edge termination structure 601 and also may be coupled to an exposed surface of the GaN epitaxial layer 201, as shown in FIG. 10A. One of ordinary skill in the art would recognize many variations, modifications, and alternatives.

Figure 10B:
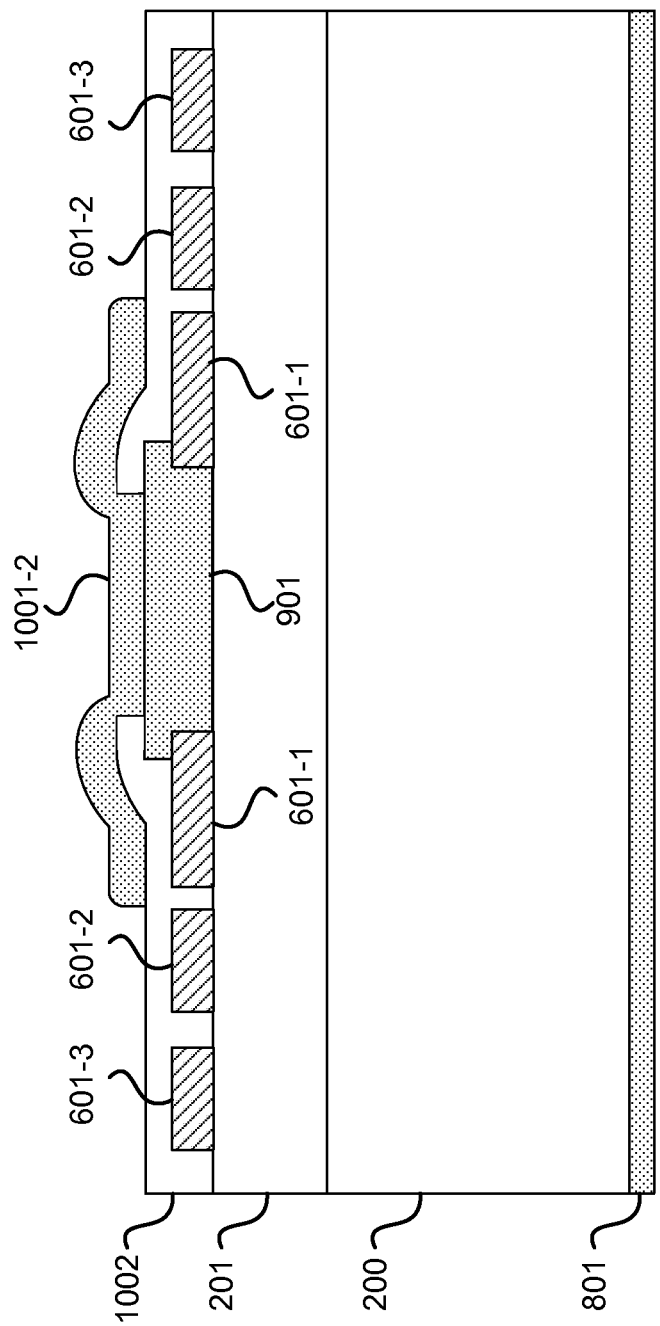

FIG. 10B illustrates the formation of additional metal field plate 1001-2 coupled to the second metal structure 901, as an alternative to the embodiment of FIG. 10A. The metal field plate 1001-2 can be formed after dielectric layer 1002 is deposited and patterned. The pattern can be formed by a controlled etch using a etch mask (not shown but patterned to expose the second metal structure 901). In alternative embodiments, the metal field plate 1001-2 can be located on any portion of the edge termination structure 601. One of ordinary skill in the art would recognize many variations, modifications, and alternatives.

Although some embodiments are discussed in terms of GaN substrates and GaN epitaxial layers, the present invention is not limited to these particular binary III-V materials and is applicable to a broader class of III-V materials, in particular III-nitride materials. Additionally, although a GaN substrate is illustrated in FIGS. 2-10B, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

The fabrication process illustrated in FIGS. 2-10B utilizes a process flow in which an n-type drift layer is grown using an n-type substrate. However, the present invention is not limited to this particular configuration. In other embodiments, substrates with p-type doping are utilized. Additionally, embodiments can use materials having an opposite conductivity type to provide devices with different functionality. Thus, although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, and the like. The substrates discussed herein can include a single material system or multiple material systems including composite structures of multiple layers. One of ordinary skill in the art would recognize many variations, modifications, and alternatives.

Figure 11:
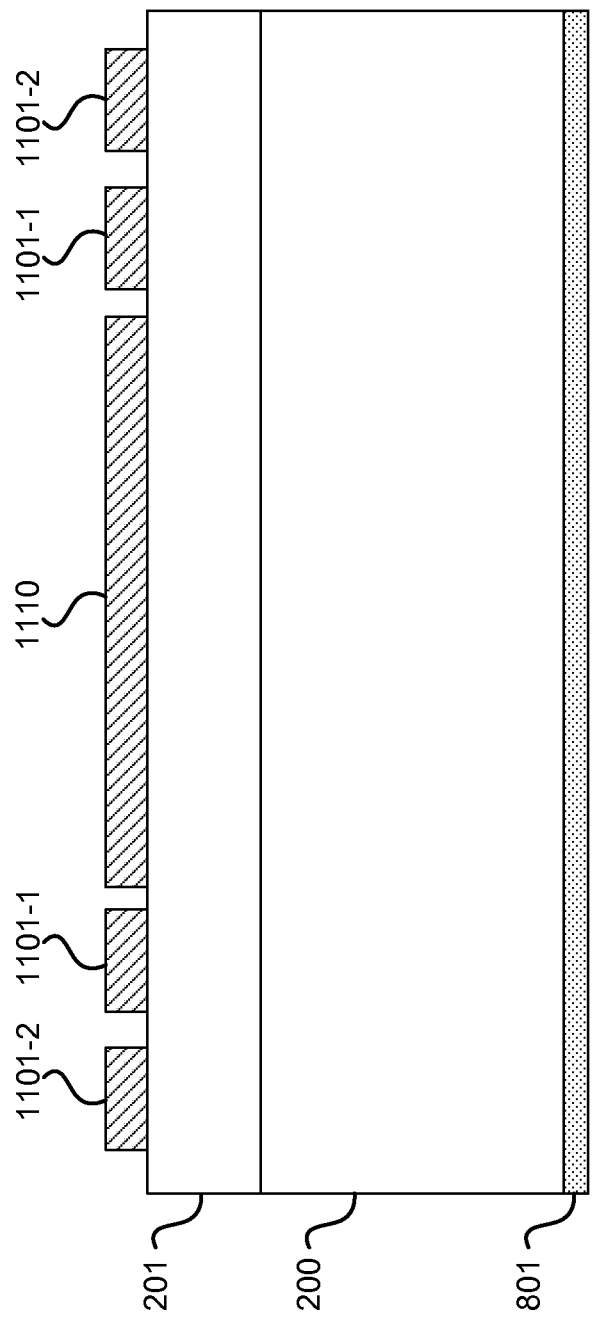
Figure 12:
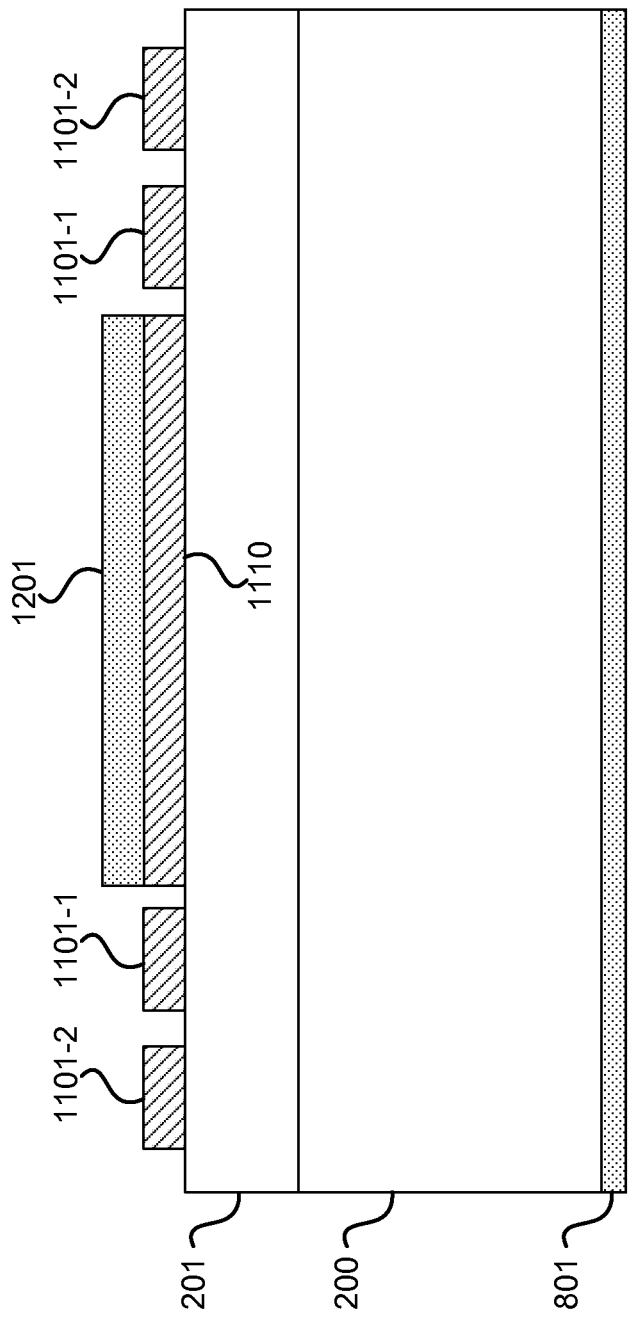
Figure 13:
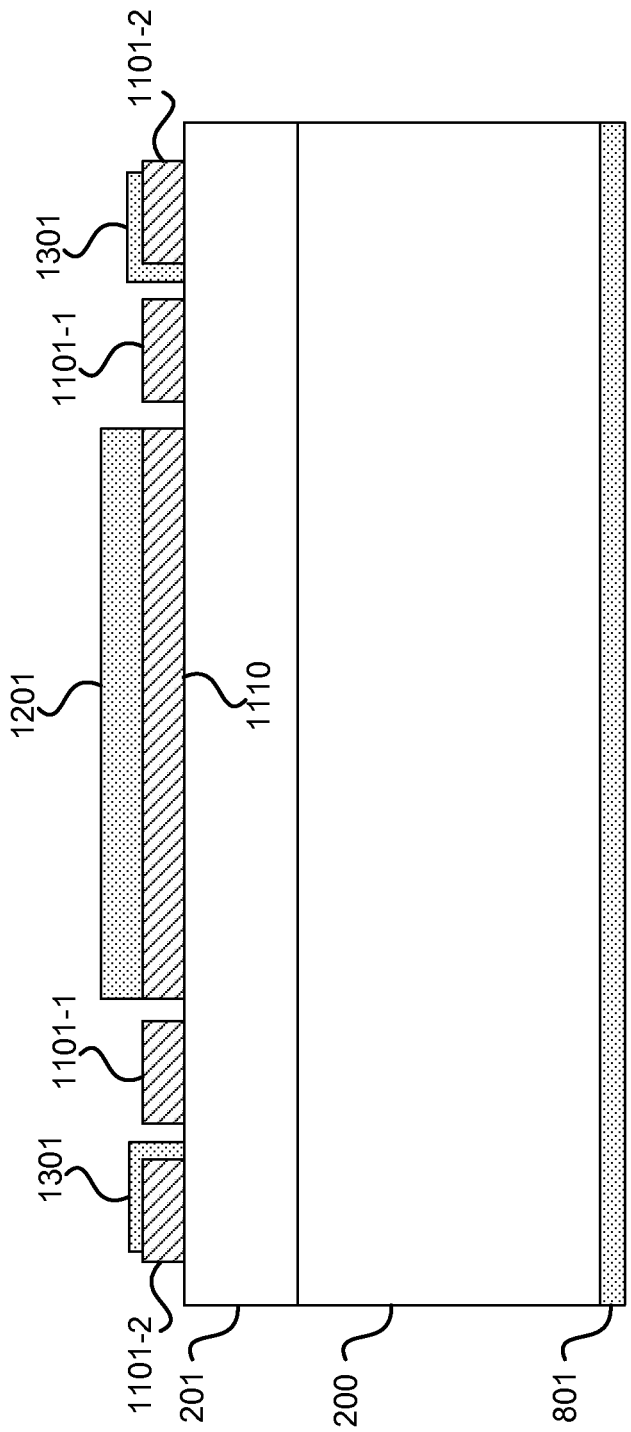

FIGS. 11-13, illustrate a process for creating a PIN diode in GaN with edge termination structures formed through selective epitaxial regrowth. The process can begin with the same steps discussed in relation to FIGS. 2-8. The structure properties, such as dopant concentrations and thicknesses, can vary from those of a Schottky diode, depending on desired functionality.

FIG. 11 illustrates a state in the process after the selective epitaxial regrowth has occurred and the masking layer(s) have been removed to form the edge termination structures 1101 configured to provide edge termination to the PIN diode. Additionally, as illustrated in FIG. 11, the selective regrowth process can be used to form a device structure 1110 with which the PIN diode can be made. For example, in one embodiment, the device structure 1110 can have a p+ conductivity type, the GaN epitaxial layer 201 can have a n− conductivity type, and the GaN substrate 200 can have an n+ conductivity type, forming the PIN layers of the PIN diode.

FIG. 12 illustrates the formation of a second metal structure 1201 (in addition to the first metal structure 801) electrically coupled to the device structure 1110. This second metal structure 1201 can be formed using the same techniques used to form the first metal structure 801, and also can include similar metals and/or alloys. The second metal structure 1201 electrically coupled to the device structure 1110 can serve as an electrical contact (e.g., an anode) for the PIN diode.

FIG. 13 illustrates the formation of metal field plates 1301 coupled to an outer portion of the edge termination structure 1101-2, similar to the metal field plates 1001-1 described in reference to FIG. 10A. These metal field plates 1301 can be formed using the same techniques used to form the metal structures 801 and 1201, and also can include similar metals and/or alloys. In alternative embodiments, the metal field plates 1301 can be located on any portion of the edge termination structure 1101, and also may be coupled to an exposed surface of the GaN epitaxial layer 201, as shown in FIG. 13. One of ordinary skill in the art would recognize many variations, modifications, and alternatives.

Figure 14:
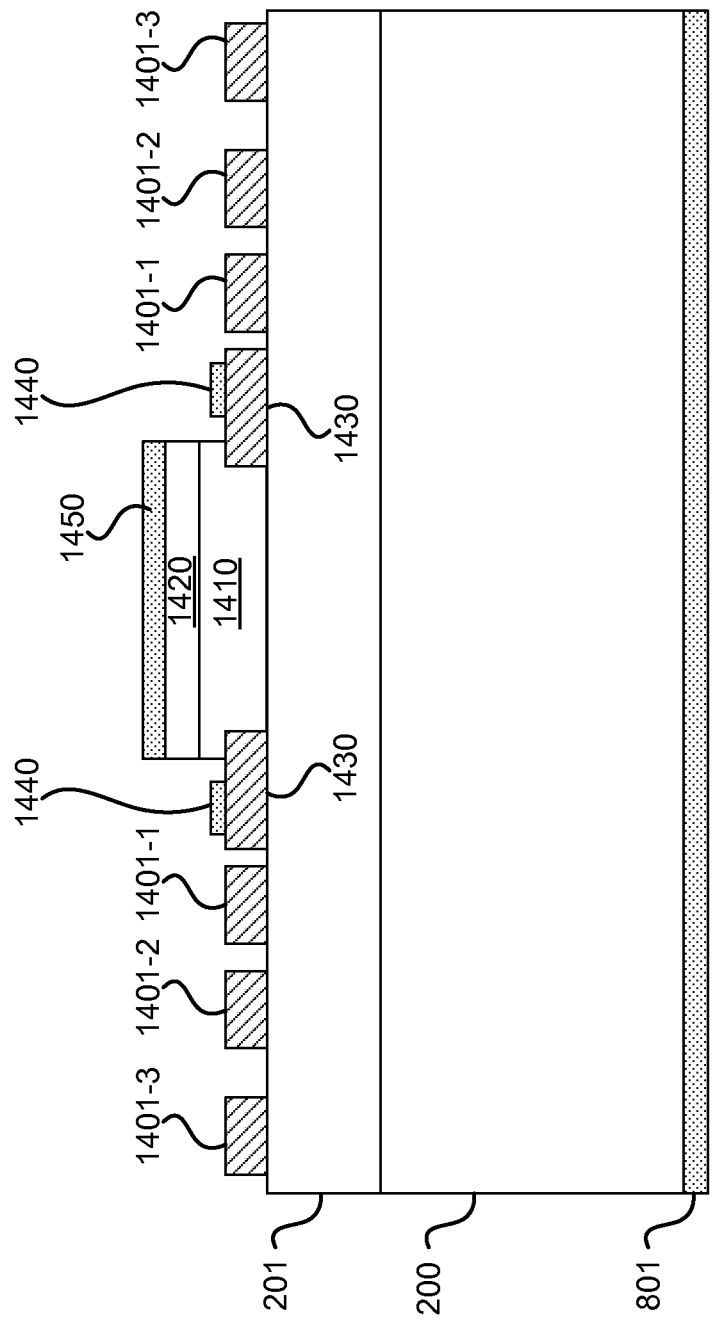
FIG. 14 is simplified cross-sectional diagram illustrating a vertical JFET with edge termination structures according to another embodiment of the present invention.

FIG. 14 is a simplified cross section of a vertical JFET with edge termination structures 1401, which can be formed using epitaxial regrowth and etching, as described herein. The vertical JFET can include a GaN substrate 200, GaN epitaxial layer 201, and first metal structure 801, similar to those in the structures discussed previously. Here, first metal structure 801 can function as a drain contact of the vertical JFET. Additionally, the JFET can include a channel region 1410, which can be formed through epitaxial regrowth and have a low dopant concentration similar to the GaN epitaxial layer 201, having the same conductivity type. Furthermore, a source region 1420 can be formed from an epitaxial layer of the same conductivity type as the channel region 1410 and the GaN epitaxial layer 201. Gate regions 1430 can be formed from the same epitaxial growth or regrowth as the edge termination structures 1401, which has an opposite conductivity type as the GaN epitaxial layer 201. Finally, ohmic metal contacts 1440 and 1450 can be provided on the gate regions 1430 and the source region 1420 to provide gate and source contacts, respectively.

For example, in some embodiments, the GaN substrate 200 can have an n+ conductivity type with dopant concentrations ranging from $1\times10^{17}$ cm$^{-3}$ to $1\times10^{20}$ cm$^{-3}$, and the GaN epitaxial layer 201 can have a n− conductivity type, with dopant concentrations ranging from $1\times10^{14}$ cm$^{-3}$ to $1\times10^{18}$ cm$^{-3}$. The thickness of the GaN epitaxial layer 201 can be anywhere from 0.5 μm and 100 μm or over 100 μm, depending on desired functionality and breakdown voltage. The channel region 1410, which can have a n− conductivity type with a dopant concentration similar to the GaN epitaxial layer 201, can be anywhere from between 0.1 μm and 10 μm thick, and the width of the channel region 1410 (i.e., the distance between gate regions 1430) for a normally-off vertical JFET can be between 0.5 μm and 10 μm. For a normally-on vertical JFET, the width of the channel region 1410 can be greater. The source region 1420 can have a thickness of between 500 Å and 5 μm and an n-type conductivity with a dopant concentration equal to or greater than $1\times10^{18}$ cm$^{-3}$. The gate regions 1430 and the components of the edge termination structures 1401-1, 1401-2, and 1401-3 can be from 0.1 μm and 5 μm thick and have a p+ conductivity type with dopant concentrations in a range from about $1\times10^{17}$ cm$^{-3}$ to about $1\times10^{20}$ cm$^{-3}$.

Figure 15:
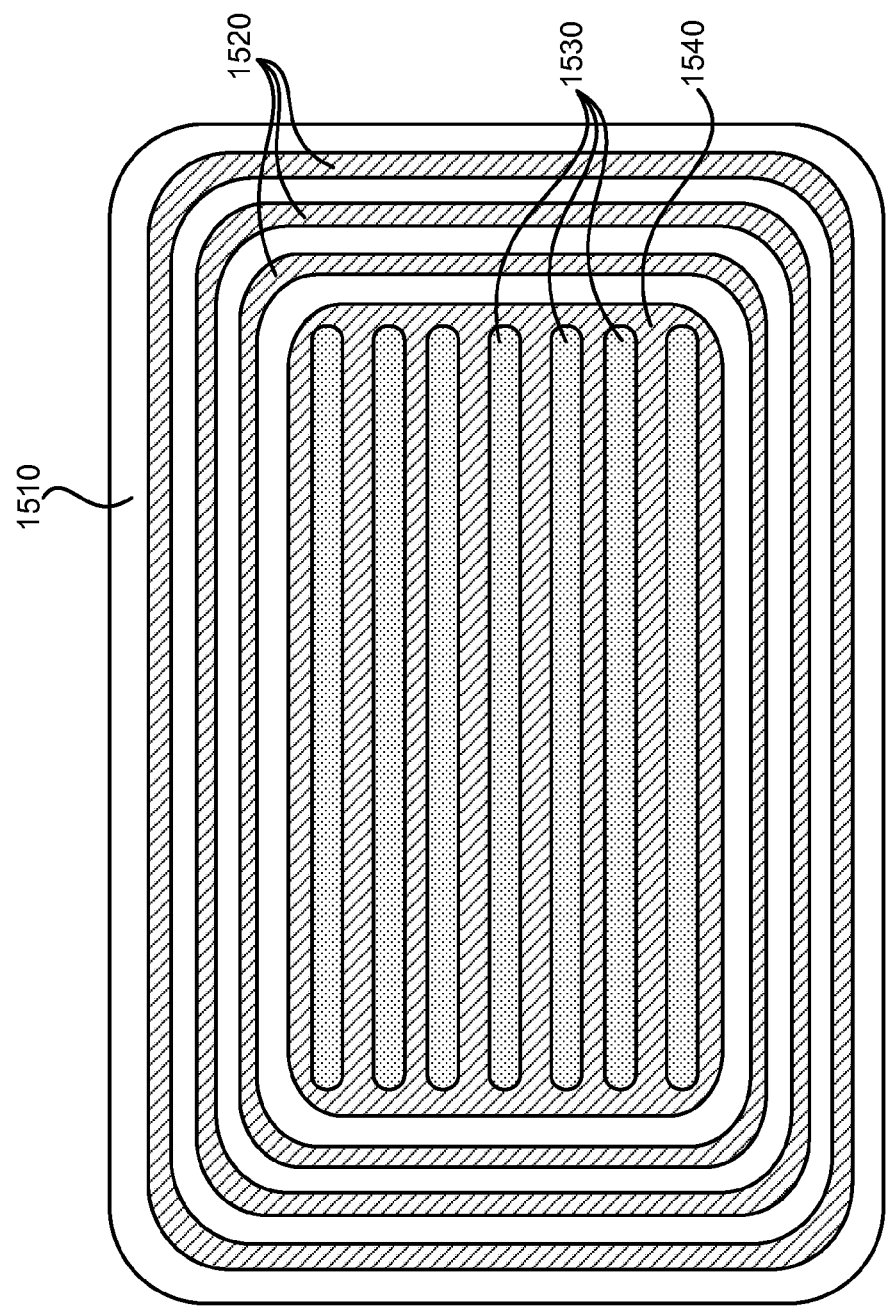
FIGS. 15-17 are simplified top-view illustrations showing different example embodiments of edge termination structures according to embodiments of the present invention.
Figure 16:
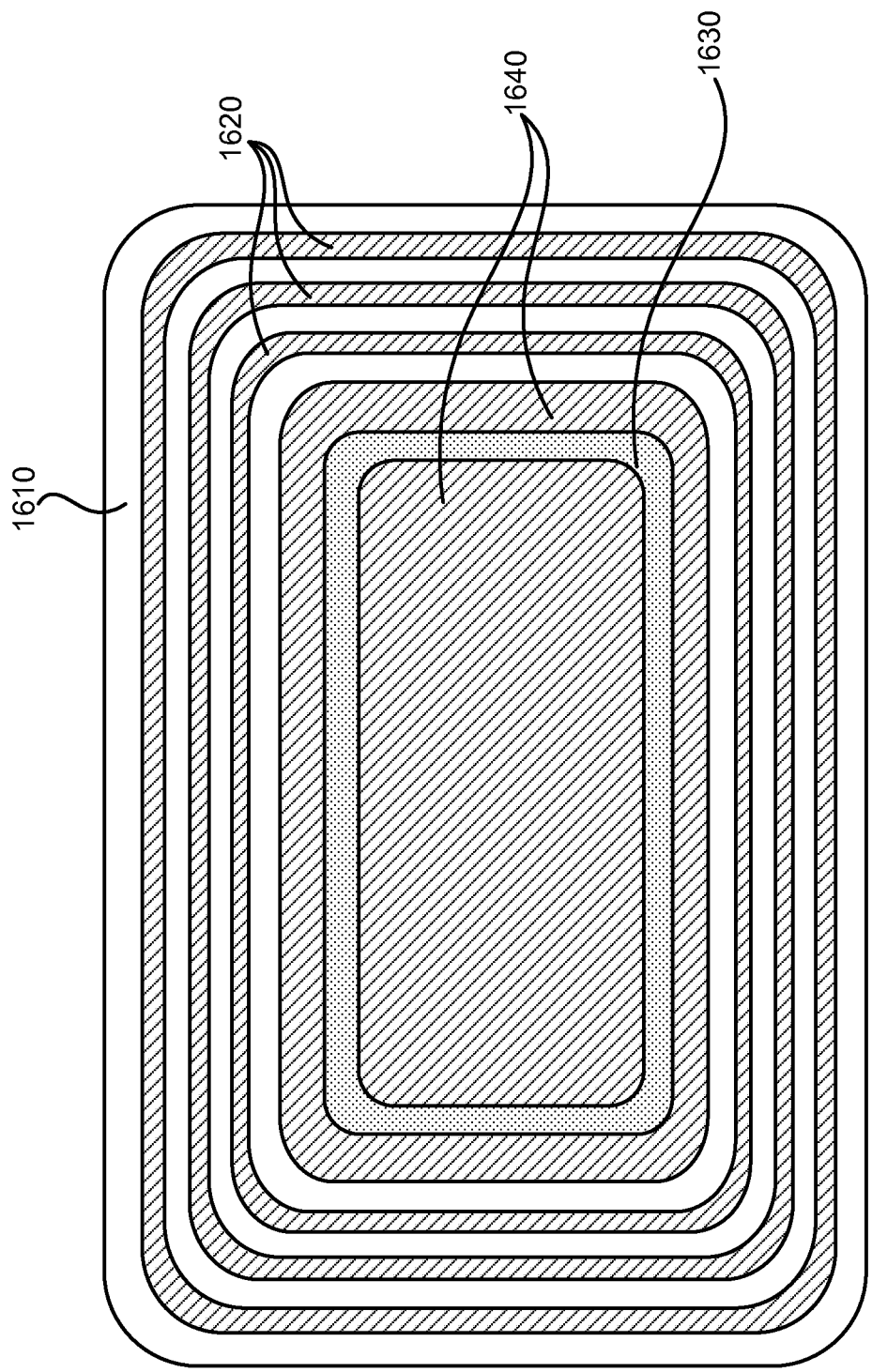
Figure 17:
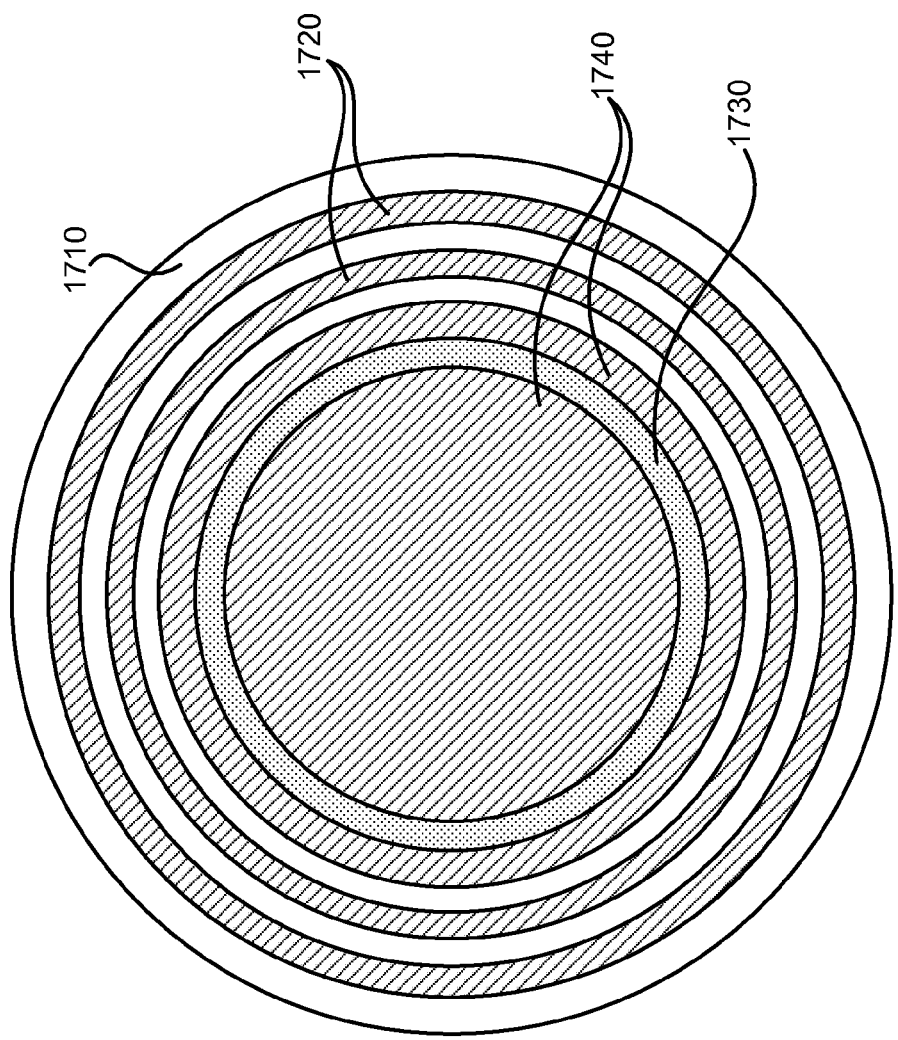

As demonstrated above, the edge termination structures described herein can provide edge termination to a variety of types of semiconductor devices. FIGS. 15-17 are simplified top-view illustrations that provide some example embodiments.

FIG. 15 illustrates an embodiment of a transistor structure with edge termination provided by three guard rings 1520. In this embodiment, the guard rings 1520 and gate structure 1540 can be made of a p+ GaN epitaxial material formed on a drift region 1510 comprised of n− GaN epitaxial layer. Multiple source regions 1530 can be made of n+ GaN epitaxial material formed on n− GaN epitaxial channel regions located between the gates.

FIG. 16 illustrates another embodiment of a transistor structure with edge termination provided by three guard rings 1620. Similar to the embodiment shown in FIG. 12, the guard rings 1620 and gate structure 1640 can be made of a p+ GaN epitaxial material formed on a drift region 1610 comprised of n− GaN epitaxial layer. A source region 1630 can be made of n+ GaN epitaxial material formed on n− GaN epitaxial channel region located between the gates formed from the gate structure 1640.

FIG. 17 illustrates yet another embodiment of a diode or transistor structure similar to the embodiment shown in FIG. 15, illustrating how edge termination structures, such as guard rings 1720, can shaped differently to accommodate differently-shaped semiconductor structures. Again, guard rings 1720 and gate structure 1740 can be made of a p+ GaN epitaxial material formed on a drift region 1710 comprised of n− GaN epitaxial layer. A source region 1730 can be made of a n+ GaN epitaxial material on n− GaN epitaxial channel region located between the gates formed from the gate structure 1740.

Figure 18:
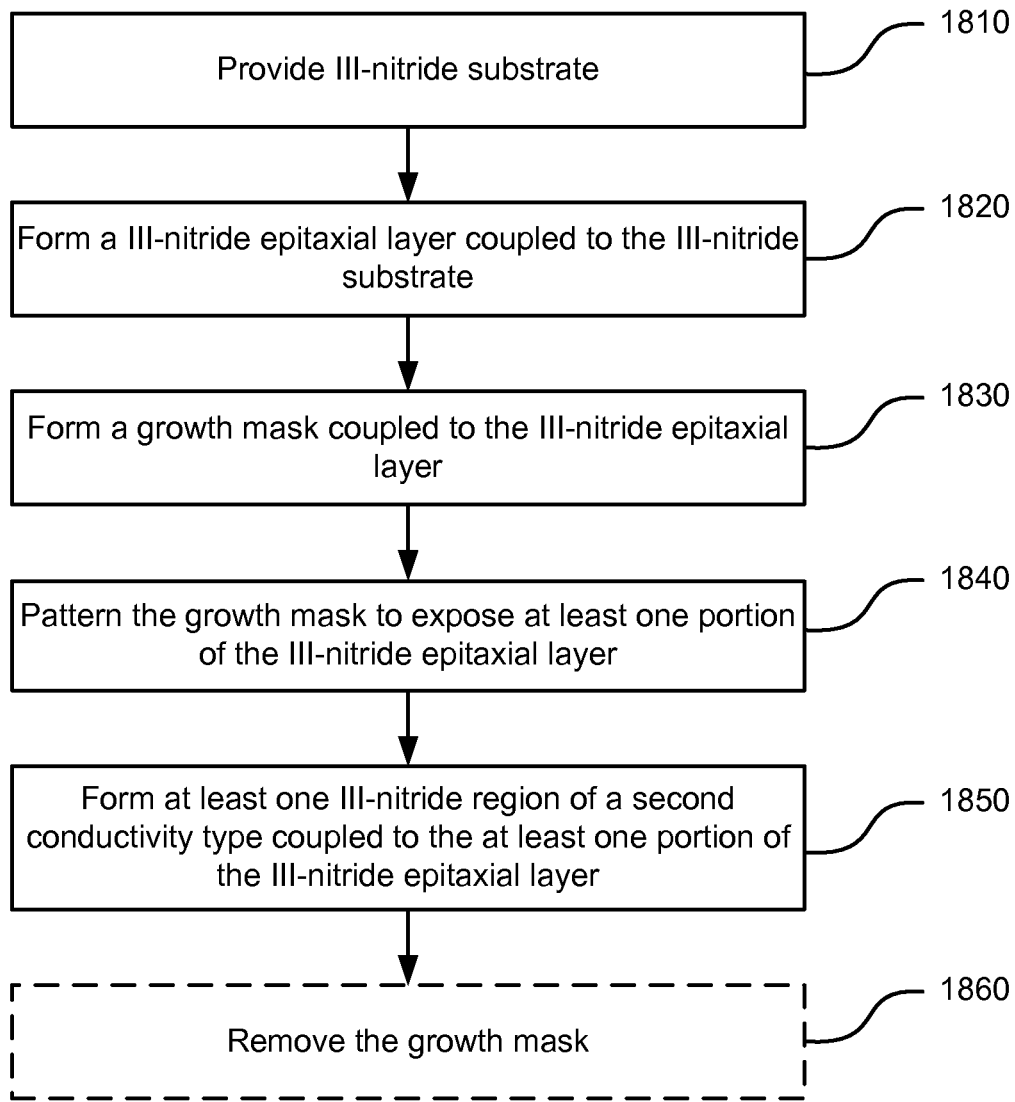
FIG. 18 is a simplified flowchart illustrating a method of fabricating a semiconductor device with edge termination structures formed through selective epitaxial regrowth according to an embodiment of the present invention.

FIG. 18 is a simplified flowchart illustrating a method of fabricating edge termination structures formed through selective epitaxial regrowth in a III-nitride material, according to an embodiment of the present invention. Referring to FIG. 18, a III-nitride substrate is provided (1810), characterized by a first conductivity type and a first dopant concentration. In an embodiment, the III-nitride is a GaN substrate with n+ conductivity type. The method also includes forming a III-nitride epitaxial layer (e.g., an n-type GaN epitaxial layer) coupled to the III-nitride substrate (1820). The III-nitride substrate and III-nitride epitaxial layer can be characterized by a first conductivity type, for example n-type conductivity, and the III-nitride epitaxial layer can have a second dopant concentration less than the first dopant concentration. Using the homoepitaxy techniques described herein, the thickness of the first III-nitride epitaxial layer can be thicker than available using conventional techniques, for example, between about 0.5 µm and about 100 µm.

The method further includes forming a growth mask coupled to the III-nitride epitaxial layer (1830). The growth mask is then patterned (e.g., etched) to expose at least one portion of the III-nitride epitaxial layer (1840). As discussed previously, the growth mask can comprise one or more layers of materials that inhibit epitaxial regrowth, thereby enabling a subsequent epitaxial regrowth to be a selective process. Such materials can include a variety of materials, including a nitride, an oxide, an oxynitride, and the like. Furthermore, the patterning of the growth mask can define the physical properties of the subsequently-regrown epitaxial structures, which can include edge termination structures and/or other structures of the semiconductor device.

The method also includes forming at least one III-nitride region of a second conductivity type coupled to the at least one portion of the III-nitride epitaxial layer (1850). Optionally, the method includes removing the growth mask (1860). If the growth mask is not removed, it simply can remain as an insulating layer. Otherwise, it can be removed with a different insulating layer regrown, or no insulating layer replacement. The as discussed elsewhere herein, any number between one to seven or more conducting regions can be formed to provide edge termination for a semiconductor device. Furthermore, the regions in the edge termination structures can be shaped any of a variety of ways, according to the physical characteristics of the semiconductor device and other considerations. The edge termination structures may circumscribe the semiconductor device, as shown in FIGS. 15-17. Furthermore, where multiple conducting regions are used in the edge termination structure, the spacing between regions may increase with increased distance from the semiconductor device.

The method illustrated in FIG. 18 can be utilized in a larger method of manufacture for any of a variety of semiconductor devices. For example, if a Schottky barrier diode is to be manufactured, a metal structure can be coupled to the III-nitride epitaxial layer to create a Schottky contact between the metal structure and the III-nitride epitaxial layer, which forms the drift layer. Alternatively, if a difference semiconductor device is to be formed, the regrowth process can include forming a device structure (e.g., a p-type layer of a PIN diode, or channel region of a JFET, or other structure of a semiconductor device). The method may also include forming a metal structure coupled to the device structure to provide an electrical contact to the semiconductor device.

It should be appreciated that the specific steps illustrated in FIG. 18 provide a particular method of fabricating edge termination structures formed through selective epitaxial regrowth according to an embodiment of the present invention. Other sequences of steps may also be performed according to alternative embodiments. For example, alternative embodiments of the present invention may perform the steps outlined above in a different order. Moreover, the individual steps illustrated in FIG. 18 may include multiple sub-steps that may be performed in various sequences as appropriate to the individual step. Furthermore, additional steps may be added or removed depending on the particular applications. One of ordinary skill in the art would recognize many variations, modifications, and alternatives.

One of ordinary skill in the art would recognize many variations, modifications, and alternatives to the examples provided herein. As illustrated herein, edge termination structures can be provided in any of a variety of shapes and forms, depending on physical features of the semiconductor device for which the edge termination structures provide edge termination. For instance, in certain embodiments, edge termination structures may not circumscribe the semiconductor device. Additionally or alternatively, conductivity types of the examples provided herein can be reversed (e.g., replacing an n-type semiconductor material with a p-type material, and vice versa), depending on desired functionality. Moreover, embodiments provided herein using GaN can use other III-nitride materials in addition or as an alternative to GaN. Other variations, alterations, modifications, and substitutions are contemplated.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating edge termination structures in gallium nitride (GaN) materials, the method comprising:
    providing a n-type GaN substrate having a first surface and a second surface;
    forming an n-type GaN epitaxial layer coupled to the first surface of the n-type GaN substrate;
    forming a growth mask coupled to the n-type GaN epitaxial layer, wherein the growth mask comprises:
        a layer of in-situ aluminum nitride (AlN) epitaxially coupled to the n-type GaN epitaxial layer, and
        a layer of silicon dioxide ($SiO_2$) in physical contact with the layer of in-situ AlN;
    patterning the growth mask to expose at least a portion of the n-type GaN epitaxial layer;
    forming at least one p-type GaN epitaxial structure coupled to the at least a portion of the n-type GaN epitaxial layer, the at least one p-type GaN epitaxial structure comprising at least one portion of an edge termination structure; and
    forming a first metal structure electrically coupled to the second surface of the n-type GaN substrate.

2. The method of claim 1 further including removing the growth mask.

3. The method of claim 1 wherein forming the at least one p-type GaN epitaxial structure includes forming a p-type device structure, the method further comprising forming a second metal structure electrically coupled to the p-type device structure.

4. The method of claim 3 wherein the second metal structure is further electrically coupled to the edge termination structure.

5. The method of claim 1 further comprising forming a second metal structure electrically coupled to the n-type GaN epitaxial layer to create a Schottky contact.

6. The method of claim 1 wherein the at least one edge termination structure circumscribes a device structure.

7. A method of fabricating a semiconductor device, the method comprising:
    providing a III-nitride substrate of a first conductivity type characterized by a first dopant concentration;
    forming a III-nitride epitaxial layer of the first conductivity type coupled to a first surface of the III-nitride substrate;

forming a growth mask coupled to the III-nitride epitaxial layer, wherein forming the growth mask comprises:
  forming a layer of in-situ silicon nitride (SiN) in physical contact with the III-nitride epitaxial layer, and
  forming a layer of silicon dioxide (SiO$_2$) in physical contact with the layer of in-situ SiN;
patterning the growth mask to expose at least one portion of the III-nitride epitaxial layer;
forming at least one edge termination structure of a second conductivity type coupled to the at least one portion of the III-nitride epitaxial layer, wherein the at least one edge termination structure comprises a III-nitride epitaxial structure; and
removing the growth mask.

8. The method of claim 7 further comprising:
forming a III-nitride epitaxial device structure coupled to the at least one portion of the III-nitride epitaxial layer; and
forming a metal structure coupled to the III-nitride epitaxial device structure.

9. The method of claim 8 wherein the III-nitride epitaxial device structure comprises a channel region and a source region of a vertical junction field-effect transistor (JFET), the method further comprising forming at least one gate region coupled to the channel region, the at least one gate region comprising a III-nitride epitaxial material of the second conductivity type.

10. The method of claim 7 wherein the at least one edge termination structure circumscribes a semiconductor device.

11. The method of claim 7 wherein the III-nitride epitaxial layer is characterized by a second dopant concentration less than the first dopant concentration.

12. The method of claim 7 wherein the forming at least one edge termination structure region comprises forming three or more edge termination structure regions with predetermined spaces between each of the three or more edge termination structure regions, wherein:
  a first spacing of the predetermined spaces is located closer to a semiconductor device than a second spacing of the predetermined spaces; and
  a width of the first spacing is smaller than a width of the second spacing.

13. The method of claim 7 further comprising forming a metal field plate coupled to at least a portion of an edge termination structure.

14. The method of claim 7 further comprising:
forming a dielectric layer coupled to at least a portion of an edge termination structure; and
forming a metal field plate coupled to the dielectric layer such that the dielectric layer is disposed between the at least a portion of the edge termination structure and the metal field plate.

15. A method of fabricating a Schottky barrier diode, the method comprising:
providing a III-nitride substrate of a first conductivity type characterized by a first dopant concentration;
forming a III-nitride epitaxial layer of the first conductivity type coupled to a first surface of the III-nitride substrate;
forming a growth mask coupled to the III-nitride epitaxial layer, wherein forming the growth mask comprises:
  forming a layer of in-situ aluminum nitride (AlN) epitaxially coupled to the III-nitride epitaxial layer, and
  forming a layer of silicon dioxide (SiO$_2$) in physical contact with the layer of in-situ AlN;
patterning the growth mask to expose a first portion of a surface of the III-nitride epitaxial layer;
forming at least one III-nitride epitaxial structure of a second conductivity type coupled to the first portion of the surface of the III-nitride epitaxial layer, the at least one III-nitride epitaxial structure configured to provide edge termination to the Schottky barrier diode;
removing the growth mask to expose a second portion of the surface of the III-nitride epitaxial layer; and
forming a first metal structure coupled to the second portion of the surface of the III-nitride epitaxial layer to create a Schottky contact.

16. The method of claim 15 wherein the first metal structure is further electrically coupled to the at least one III-nitride epitaxial structure.

17. The method of claim 15 further comprising forming a second metal structure coupled to the III-nitride substrate.

18. The method of claim 15 further comprising forming a metal field plate coupled to the at least one III-nitride epitaxial structure.

19. The method of claim 15 further comprising:
forming a dielectric layer coupled to the at least one III-nitride epitaxial structure; and
forming a metal field plate coupled to the dielectric layer such that the dielectric layer is disposed between the at least one III-nitride epitaxial structure and the metal field plate.

* * * * *